(12) United States Patent
Saiki et al.

(10) Patent No.: US 7,808,086 B2
(45) Date of Patent: Oct. 5, 2010

(54) LEAD FRAME AND MANUFACTURING METHOD THEREOF, AND SEMICONDUCTOR APPARATUS AND MANUFACTURING METHOD THEREOF

(75) Inventors: Akimi Saiki, Kawasaki (JP); Hiroyuki Shoji, Kawasaki (JP); Gousuke Takahashi, Hitachi (JP); Noriyuki Hasegawa, Hitachi (JP); Fumio Takano, Hitachi (JP); Kouji Sato, Yonezawa (JP)

(73) Assignees: NEC Electronics Corporation, Kanagawa (JP); Hitachi Cable Precision Co., Ltd., Yamagata (JP)

( * ) Notice: Subject to any disclaimer, the term of this patent is extended or adjusted under 35 U.S.C. 154(b) by 175 days.

(21) Appl. No.: 12/129,297

(22) Filed: May 29, 2008

(65) Prior Publication Data

US 2008/0296746 A1 Dec. 4, 2008

(30) Foreign Application Priority Data

May 30, 2007 (JP) ............................. 2007-143309

(51) Int. Cl.
*H01L 23/495* (2006.01)
(52) U.S. Cl. ..................................... 257/669; 257/676
(58) Field of Classification Search ................ 257/669, 257/676
See application file for complete search history.

(56) References Cited

U.S. PATENT DOCUMENTS

| 2003/0006492 | A1* | 1/2003 | Ogasawara et al. | 257/684 |
| 2003/0071333 | A1* | 4/2003 | Matsuzawa | 257/676 |
| 2003/0127711 | A1* | 7/2003 | Kawai et al. | 257/666 |
| 2005/0093118 | A1* | 5/2005 | Itou et al. | 257/676 |

FOREIGN PATENT DOCUMENTS

JP 2002-26190 A 1/2002

* cited by examiner

Primary Examiner—Thien F Tran
(74) Attorney, Agent, or Firm—Sughrue Mion, PLLC

(57) ABSTRACT

The present invention includes a plurality of mounting portions on which a semiconductor element is mounted, a plurality of electrodes to which the semiconductor elements that are mounted on each of the mounting portions are electrically connected, a corner portion which connects the plurality of mounting portions and which has a hanging lead piece that supports the mounting portions and an electrode connection piece that connects the plurality of electrodes, and a half-blanking portion that has a concave portion formed in a thickness direction of the lead frame and a protrusion formed at a position corresponding to the concave portion, and which is covered with a sealing resin material that seals the semiconductor element. A stress-dispersing portion for dispersing stress that arises, when the half-blanking portion is formed, is provided in the corner portion.

7 Claims, 15 Drawing Sheets

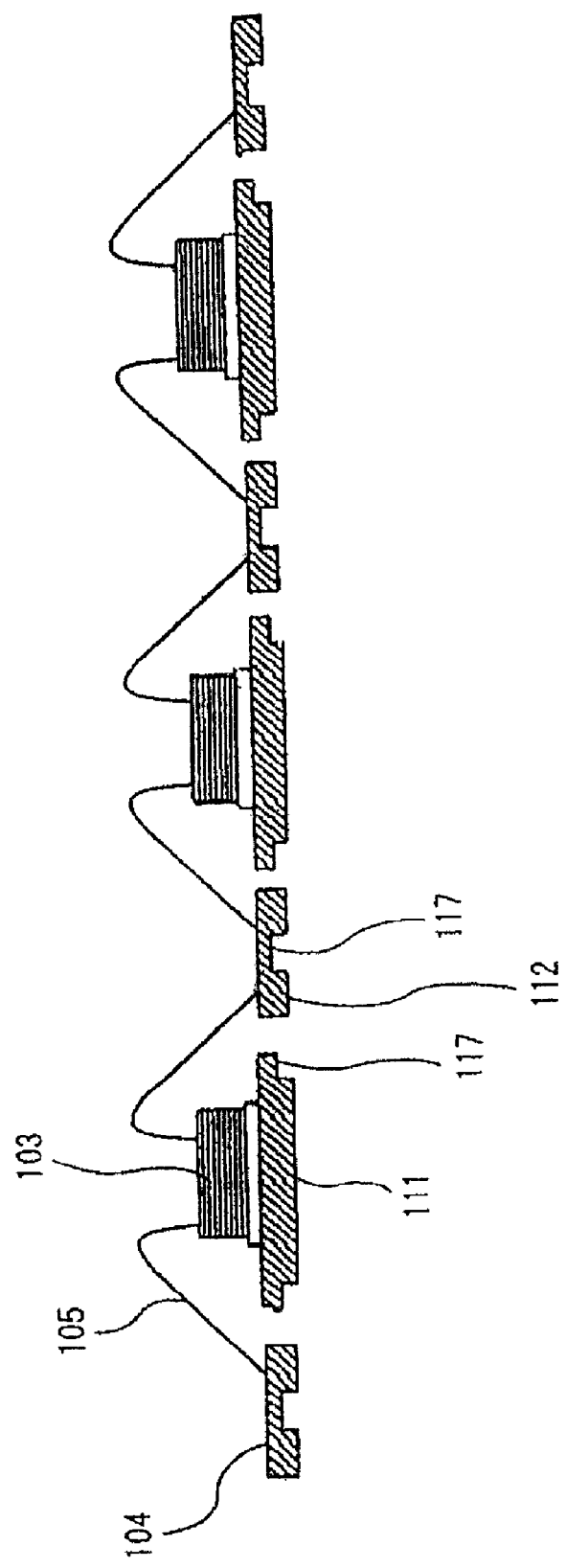

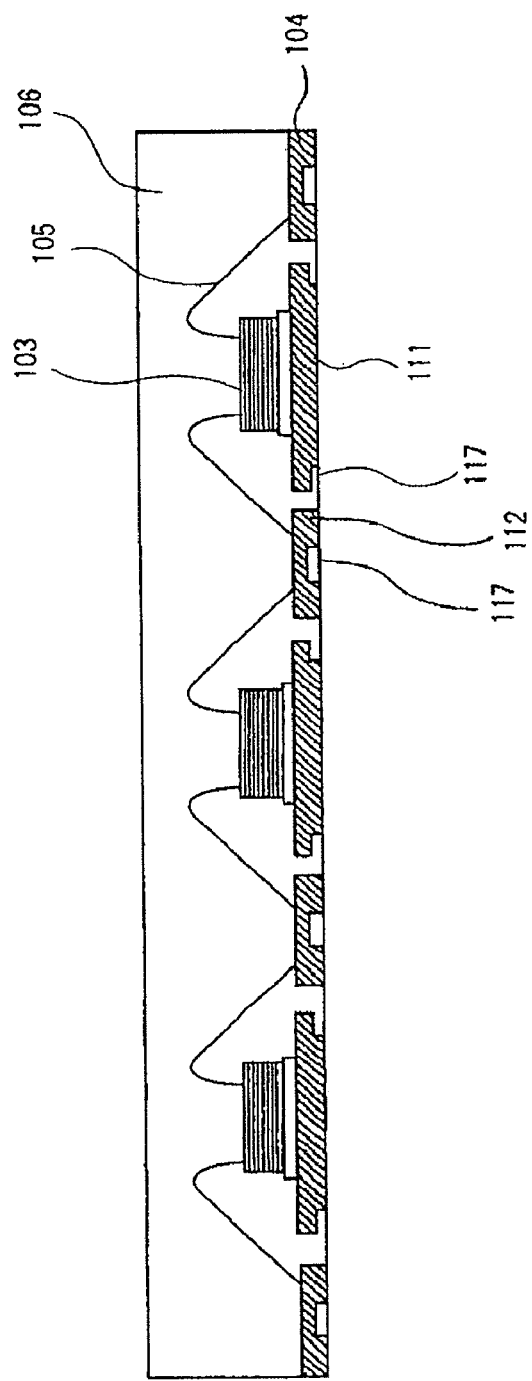
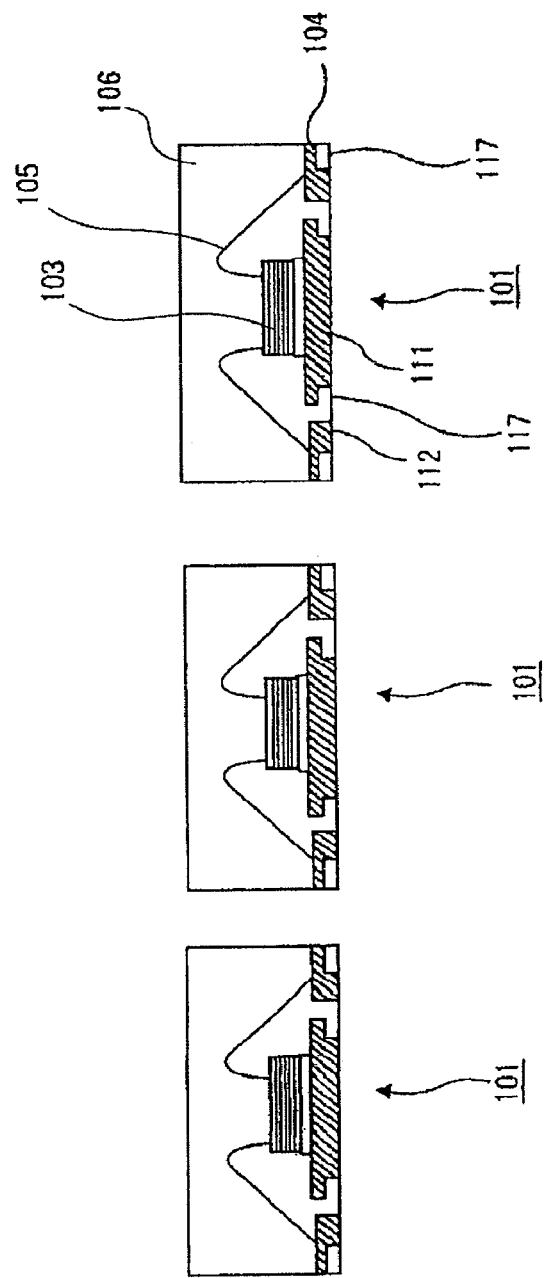
Fig. 6A
Fig. 6B (A-A)

(B-B)

LEAD FRAME AND MANUFACTURING METHOD THEREOF, AND SEMICONDUCTOR APPARATUS AND MANUFACTURING METHOD THEREOF

This application is based upon and claims the benefit of priority from Japanese Patent Application No. 2007-143309 filed on May 30, 2007, the content of which is incorporated by reference.

BACKGROUND OF THE INVENTION

1. Field of the Invention

The present invention relates to a lead frame comprising a plurality of mounting portions on which semiconductor elements are mounted, a manufacturing method thereof, a semiconductor apparatus, and a method of manufacturing the semiconductor apparatus.

2. Description of the Related Art

Recently, accompanying down-sizing of semiconductor packages, there is an increasing number of semiconductor packages having a leadless structure that are manufactured according to a batch sealed assembly method. According to the batch sealed assembly method, a pattern corresponding to a plurality of semiconductor elements is arranged on a single lead frame, respective semiconductor elements are mounted and bonded thereon, and thereafter the plurality of semiconductor elements are sealed together in one batch using a sealing resin material. In this assembly method, after the semiconductor elements are sealed with a resin material, the lead frame is divided by dicing to obtain single semiconductor elements as individual pieces.

For example, as shown in FIG. 1, lead frame 104 of this type includes a plurality of mounting portions 111 on which semiconductor elements are mounted, a plurality of electrodes 112 to which respective semiconductor elements are electrically connected, and corner portions 113 that connect the plurality of mounting portions 111. Corner portion 113 has a plurality of hanging lead pieces 115 that support mounting portion 111, and electrode connection piece 116 that connects the plurality of electrodes 112. As shown in FIG. 2, in corner portion 113 that comprises lead frame 104, a plurality of electrode connection pieces 116 are formed to intersect at the center part of corner portions 113 in a cross shape.

Further, as shown in FIG. 3, as the corner portion of another lead frame related to the present invention, Japanese Patent Laid-Open No. 2002-26190 (FIG. 7) discloses annular corner portion 123 in which a plurality of hanging lead pieces 115 and a plurality of electrode connection pieces 116 are connected to form a quadrilateral shape.

As shown in FIG. 4, to obtain a so-called anchor effect which is a favorable bonding state using sealing resin material 106, lead frame 104 related to the present invention that is usable with the above described batch sealed assembly method is formed with concave portion 117 in the thickness direction of lead frame 104 by performing a half-etching process at a plurality of places such as the side of outer circumference of mounting portions 111, hanging lead pieces 115, or electrode connection pieces 116. Therefore, a lead frame related to the present invention is, in general, formed by an etching process. This leads to an increase in manufacturing cost.

Next, a method of manufacturing a semiconductor package related to the present invention that uses lead frame 104 in which concave portion 117 is formed by an etching process will be briefly described.

According to the method of manufacturing a semiconductor package related to the present invention, as shown in FIG. 5 semiconductor elements 103 are mounted on mounting portions 111 of lead frame 104, and semiconductor elements 103 and electrodes 112 are electrically connected through wires 105. Subsequently, as shown in FIG. 6A, a plurality of semiconductor elements 103, electrodes 112, wires 105, and a surface on one side of lead frame 104 are covered and sealed with sealing resin material 106. Finally, as shown in FIG. 6B, lead frame 104 that is covered with sealing resin material 106 is cut at corner portions 113 to divide lead frame 104 into individual semiconductor packages 101.

According to a semiconductor package manufactured as described above, when the dimension of a side of the outer shape of a square semiconductor package is formed to be less than 3 mm, the number of semiconductor elements arranged on a single lead frame is comparatively large. Therefore, even when a lead frame formed by an etching process is used, the manufacturing cost can be made comparatively small. However, particularly in the case of a comparatively large semiconductor package in which the dimension of a side of the outer shape of a semiconductor package is formed to be 3 mm or more, the number of manufactured semiconductor packages per lead frame is comparatively small, and therefore the manufacturing cost increases. Therefore, it is desirable to decrease the manufacturing cost by using press working as the lead frame manufacturing process.

In adopting press working as the manufacturing process for half-etching processing as described above, the lead frame is subjected to a crushing process using a metal mold or the like. In the crushing process, stress and strain arises in the lead frame. Accordingly, in the case of a structure having a relatively large number of places to undergo a crushing process, such as a lead frame used in a batch sealed assembly method, the stress and strain, produced by the crushing process, accumulates. There is thus the problem that the lead frame warps significantly and changes shape. Consequently, it has been difficult to adopt press working as the manufacturing process for lead frames.

In general, performing the so-called half blanking process is considered a countermeasure that reduces stress and strain that constitutes a problem when a concave portion in a lead frame is formed by a crushing process. In the half blanking process, in addition to forming a concave portion in the thickness direction of the lead frame, a protrusion corresponding to the concave portion is also formed to reduce stress and strain that arises in the lead frame. Generally, in the case of a crushing process, stress and strain is produced over the entire area that is being crushed. In contrast, in the case of a half blanking process, because stress and strain only arises at boundary portions of the half blanking process, the amount of stress and strain is comparatively small.

However, even when half blanking on a lead frame is performed, in the case of a lead frame that is used with a batch sealed assembly method, a lead frame for a plurality of semiconductor packages is linked at places that are subject to the half blanking process. Consequently, stress that occurs in the half blanking process, is conveyed from the side of the mounting portion, that occupies a comparatively large area in the lead frame via the hanging lead pieces, to concentrate at a center portion where the hanging lead pieces intersect at the center of the corner portion, and a force that reacts to the stress, acts towards the center of the mounting portion.

Accordingly, in a lead frame, when four corner portions are arranged around a square mounting portion, the forces react to the stress come from the four corner portions that are concentrated in the center of the mounting portion. Therefore, it has not been possible to prevent the mounting portion of the lead frame from changing shape due to these forces react to the stress.

In the structure of the corner portion of the lead frame also disclosed in aforementioned Japanese Patent Laid-Open No. 2002-26190, there are locations where hanging lead pieces and electrode connection pieces are perpendicularly connected. Consequently, there is the problem that stress that arises when a half blanking process is performed is not favorably dispersed, and the forces react to the stress concentrate at the mounting portion and deformation of the mounting portion can not be prevented.

Accordingly, it has been difficult to form a lead frame which can be used with a batch sealed assembly method by press working in a process for manufacturing a semiconductor package related to the present invention.

SUMMARY OF THE INVENTION

An object of the present invention is to provide a lead frame capable of preventing deformations arising in mounting portions when a half-blanking portion in a lead frame is formed, a manufacturing method thereof, a semiconductor apparatus, and a method of manufacturing the semiconductor apparatus.

A lead frame according to the present invention that achieves the aforementioned object includes:

a plurality of mounting portions on which a semiconductor element is mounted;

a plurality of electrodes to which the semiconductor element mounted on the respective mounting portion is electrically connected;

a corner portion which connects a plurality of mounting portions and which has a hanging lead piece that supports a mounting portion, and an electrode connection piece that connects a plurality of electrodes; and a half-blanking portion which is having a concave portion that is formed in a thickness direction of the lead frame and a protrusion that is formed at a position corresponding to the concave portion, and which is covered with a sealing resin material to seal the semiconductor element. A stress-dispersing portion for dispersing a stress that arises when forming the half-blanking portion is provided in the corner portion.

In the lead frame according to the present invention that is structured as described above a stress that is conveyed via the hanging lead piece from the side of the mounting portion when forming a half-blanking portion in the lead frame is dispersed by the stress-dispersing portion provided in the corner portion. Therefore, the force reacts to the stress that is conveyed to the mounting portion from the corner portion decreases, and the occurrences of deformations in the mounting portion are suppressed. In addition, according to this lead frame, both the protrusion and the concave portion of the half-blanking portion enter a wedge-like state inside the sealing resin material that seals the semiconductor element, to thereby obtain the so-called anchor effect. Consequently, the anchor effect of the present invention is improved in comparison with the structure related to the present invention that has only a concave portion formed by an etching process.

The stress-dispersing portion comprised by the lead frame according to the present invention has a plurality of beams that connect hanging lead pieces and electrode connection pieces in an arc shape. The plurality of beams is formed in a connected ring shape. According to this structure, when the half-blanking portion is formed in the lead frame, stress that is conveyed along a hanging lead piece from the side of the mounting portion is conveyed from the hanging lead piece via the arc-shaped beams towards a direction that is substantially tangential with the arc formed by the beams. The stress is then conveyed to the side of the electrode connection piece while being attenuated by the beams that bend to some degree. Therefore, the stress that is conveyed from the side of the mounting portion is dispersed and attenuated at the stress-dispersing portion. Thus, the size of the force reacts to the stress that is conveyed to the side of the mounting portion from the corner portion is relatively small. As a result, even in a case in which the lead frame has a structure in which four corner portions are arranged around a mounting portion, deformation of the mounting portion caused by forces react to the stress that come from the four corner portions, is prevented.

The thickness in the thickness direction of the concave portion of the half-blanking portion comprised by the lead frame according to the present invention is preferably within the range of 40% or more to 65% or less with respect to the thickness of the lead frame. With regard to the depth in the thickness direction of the concave portion, when the depth is less than 40%, since elastic deformation may occur easily in the half blanking process and result in inadequate plastic deformation, it is difficult to stabilize the working shape or dimensions. In addition, when the depth is less than 40%, a sufficient anchor effect cannot be obtained. In contrast, when the depth exceeds 65%, a shearing region increases in the half blanking process. As a result, the possibility of the lead frame rupturing increases. Accordingly, the depth in the thickness direction of the concave portion is preferably within the range of 40% or more to 65% or less with respect to the thickness of the lead frame, and in particular a depth of approximately 50%, i.e. about ½, is desirable.

Further, in the lead frame according to the present invention, at a cross section that intersects in the thickness direction with a boundary of the half-blanking portion, a cross-sectional area per unit length at a portion intersecting the boundary is preferably made substantially equal with the cross-sectional area per unit length at a portion that does not intersect with a boundary. According to this structure, by ensuring that the cross-sectional area of the lead frame does not vary with respect to a state before and after formation of the half-blanking portion in the lead frame, stress and strain that occur when forming the half-blanking portion in the lead frame are suppressed, and deformation of the lead frame can be further prevented.

Furthermore, in the half-blanking portion comprised by the lead frame according to the present invention, a side wall in the thickness direction of the protrusion and the concave portion preferably inclines with respect to the thickness direction. According to this structure, a punch of a metal mold for forming the half-blanking portion in the lead frame has enhanced release characteristics when the punch separates from the half-blanking portion, and thus the machining dimensions of the half-blanking portion can be stabilized.

A method of manufacturing a lead frame according to the present invention comprises:

firstly, performing punching to form a lead frame comprising:

a plurality of mounting portions on which a semiconductor element is mounted, a plurality of electrodes to which the semiconductor element that is mounted on the respective mounting portion is electrically connected, and a corner portion which connects a plurality of mounting portions and which has a hanging lead piece that supports a mounting portion, and an electrode connection piece that connects a plurality of electrodes; and secondly, forming in the lead frame a half-blanking portion having a concave portion that is formed in a thickness direction from a rear side which is opposite to the front side on which a semiconductor element is mounted and a protrusion that is formed on the front side at a position corresponding to the concave portion, and which is covered with a sealing resin material to seal the semiconductor element. Further, when firstly performing punching to form a lead frame, a stress-dispersing portion for dispersing stress that arises when forming the half-blanking portion is provided in the corner portion.

Further, a method of manufacturing a semiconductor apparatus according to the present invention comprises:

firstly, performing punching to form a lead frame comprising:

a plurality of mounting portions on which a semiconductor element is mounted, a plurality of electrodes to which the semiconductor element that is mounted on the respective mounting portion is electrically connected, and a corner portion which connects a plurality of mounting portions and which has a hanging lead piece that supports a mounting portion, and an electrode connection piece that connects a plurality of electrodes;

secondly, forming in the lead frame a half-blanking portion having a concave portion that is formed in a thickness direction from a rear side which is opposite to the front side on which a semiconductor element is mounted and a protrusion that is formed on the front side at a position corresponding to the concave portion, and which is covered with a sealing resin material to seal the semiconductor element;

thirdly, mounting semiconductor elements on the mounting portions of the lead frame;

fourthly, electrically connecting the semiconductor elements and electrodes through a wiring material;

fifthly, sealing the half-blanking portion, the semiconductor elements, and the wiring material with a sealing resin material; and sixthly, cutting the lead frame along the length of electrode connection pieces to divide the lead frame into individual semiconductor apparatuses. Further, when firstly performing punching to form a lead frame, a stress-dispersing portion for dispersing a stress that arises when forming the half-blanking portion is provided in the corner portion.

According to the present invention, it is possible to implement press working that has been difficult to implement heretofore for a lead frame to be used with a batch sealed assembly method, and to decrease the manufacturing cost of a lead frame that has conventionally been formed by an etching process. According to the present invention, in implementing press working, it is possible to suppress stress and strain that occurs when forming a half-blanking portion and to also stabilize the machining dimensions of the half-blanking portion so that it is hard to rupture the lead frame. The present invention can also enhance an anchor effect between a lead frame and a sealing resin material.

BRIEF DESCRIPTION OF THE DRAWINGS

FIG. 5 is a sectional view that illustrates a manufacturing process of a semiconductor package related to the present invention;

FIG. 6A is a sectional view that illustrates a manufacturing process of a semiconductor package related to the present invention;

FIG. 6B is a sectional view that illustrates a manufacturing process of a semiconductor package related to the present invention;

DETAILED DESCRIPTION OF THE EXEMPLARY EMBODIMENTS

Hereunder, a specific embodiment of the present invention is described with reference to the drawings.

Figure 1:
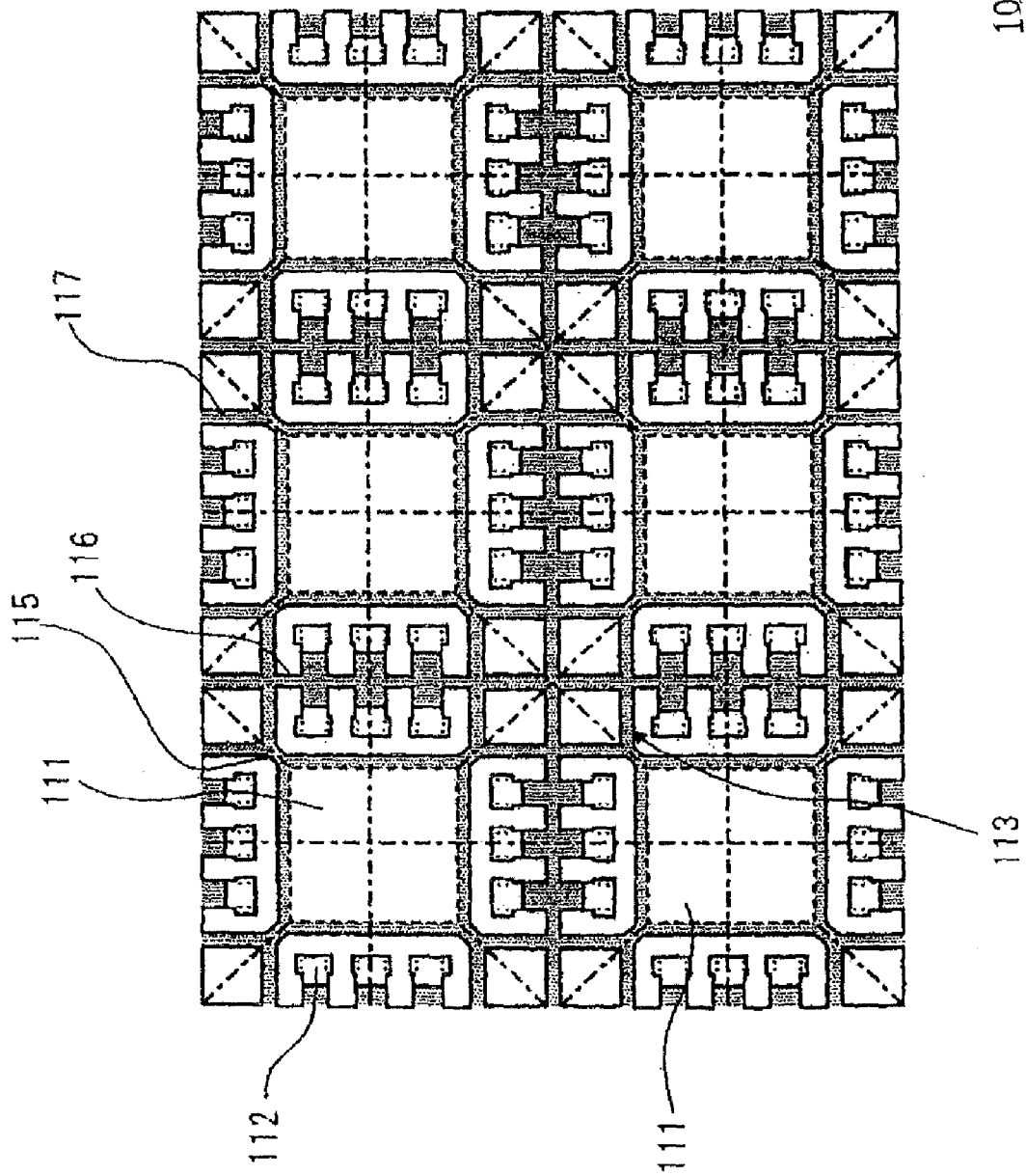
FIG. 1 is a plan view that illustrates a lead frame used in a semiconductor package related to the present invention.
Figure 2:
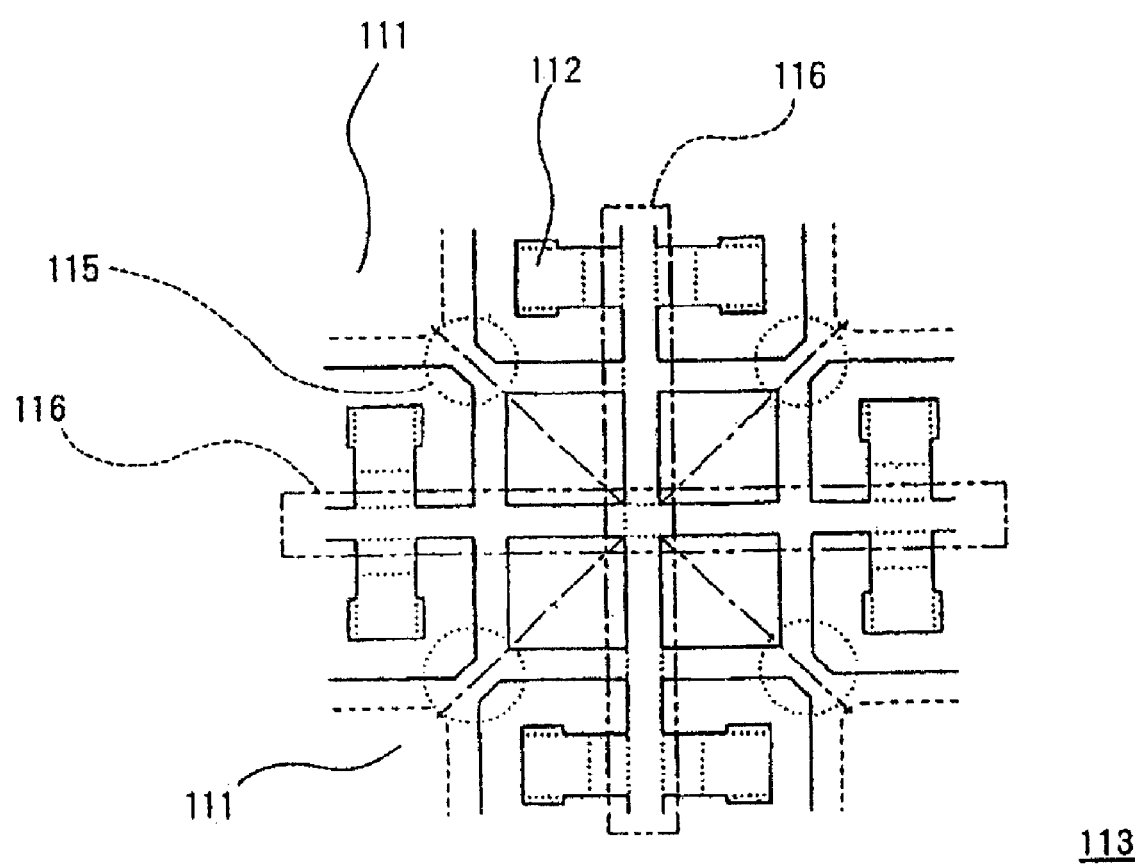
FIG. 2 is a plan view that shows an enlarged view of corner portions of a lead frame related to the present invention.
Figure 3:
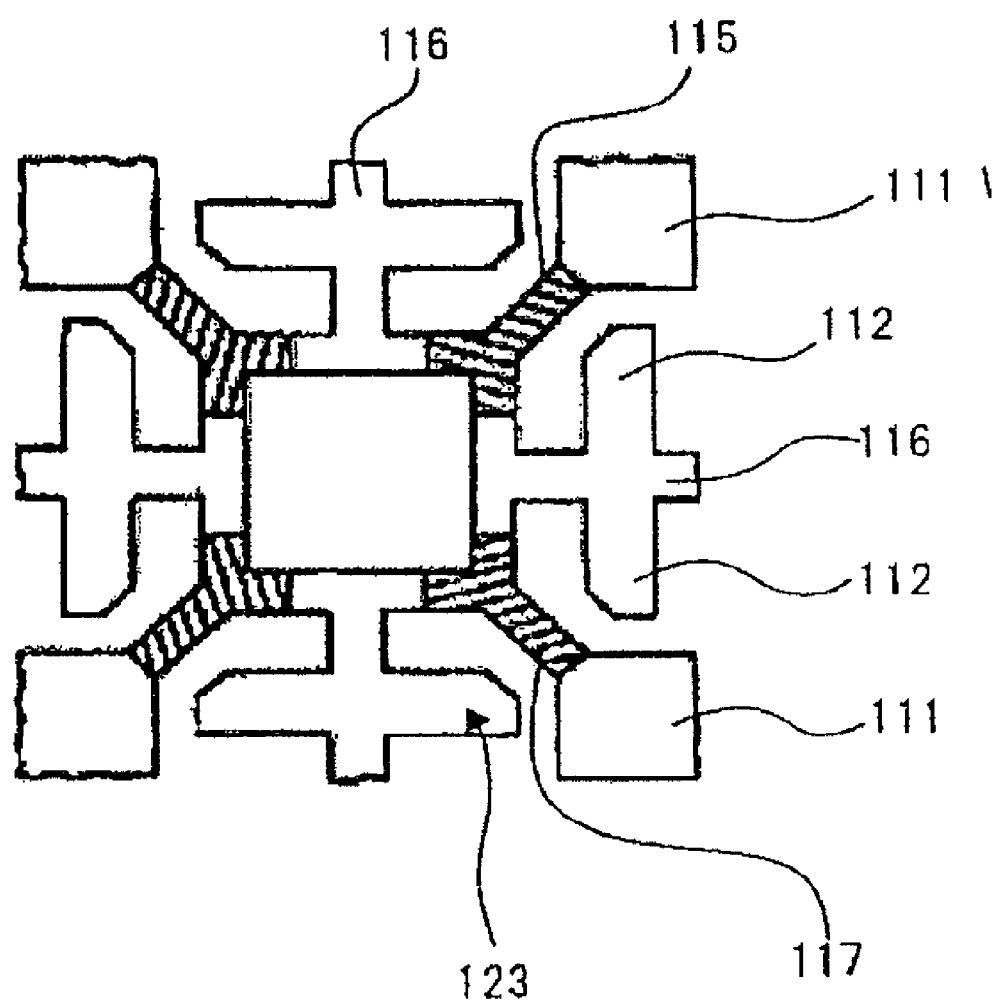
FIG. 3 is a plan view that shows an enlarged view of corner portions of another lead frame related to the present invention.
Figure 4:
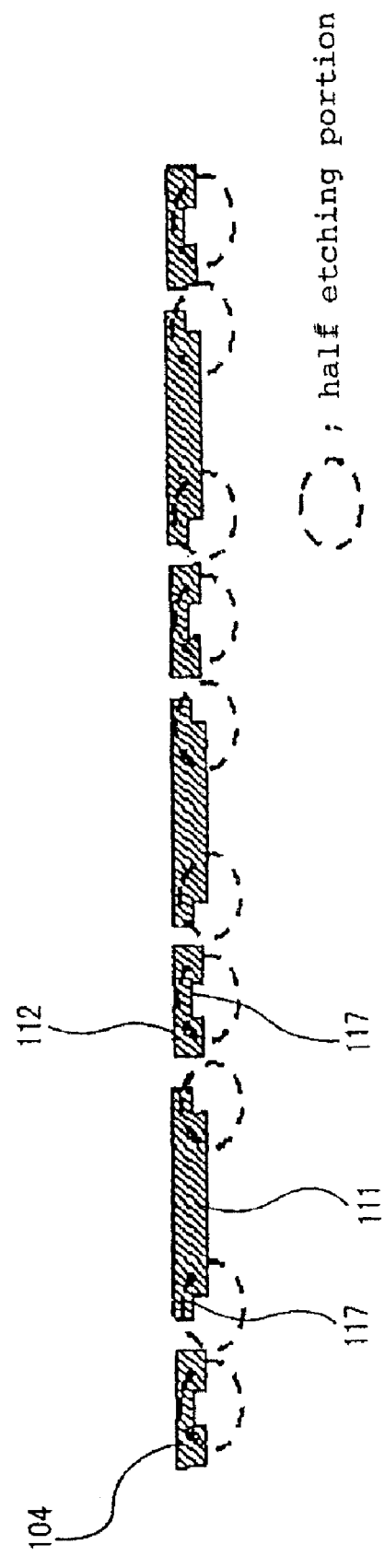
FIG. 4 is a sectional view that illustrates a manufacturing process of a lead frame related to the present invention.
Figure 7:
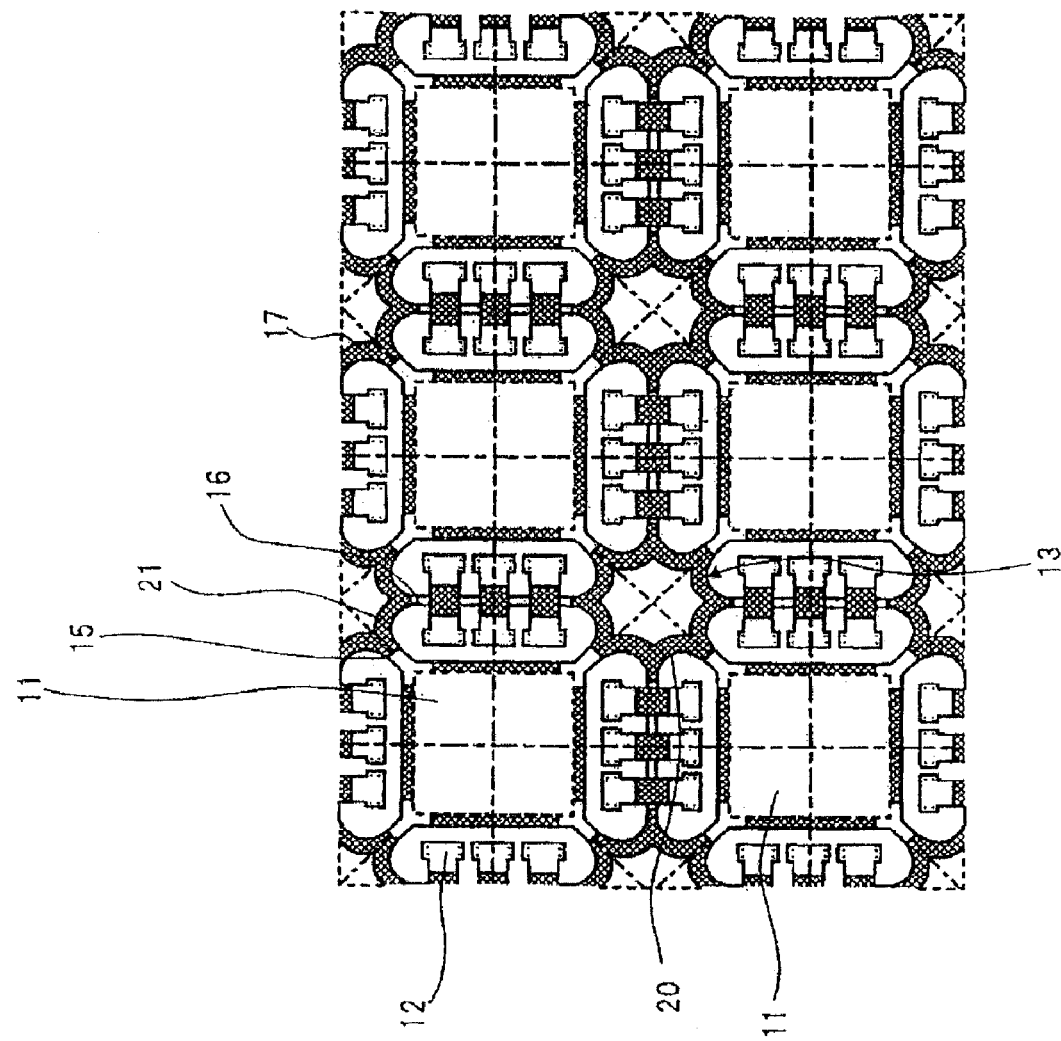
FIG. 7 is a plan view illustrating a lead frame according to an embodiment of the present invention.

As shown in FIG. 7, lead frame 4 of the present embodiment comprises a plurality of mounting portions 11 on which semiconductor elements 3 are mounted, a plurality of electrodes 12 to which terminals of semiconductor elements 3 that are mounted on mounting portions 11 are electrically connected, and corner portions 13 that extend outward from each mounting portion 11 to connect a plurality of mounting portions 11. Components that are equivalent to a plurality of semiconductor packages are arranged on one lead frame 4.

Lead frame 4 illustrated in FIG. 7 is a configuration example for a 12-pin semiconductor package in which a pattern that is equivalent to the amount for a single semiconductor package is formed by single mounting portion 11 and a total of 12 electrodes 12. Three electrodes 12 are provided on each side of the outer circumference of mounting portion 11. Thus, in a single lead frame 4, the amount of the above described patterns that is equivalent to a plurality of single semiconductor packages is arranged in a lattice shape. Corner portion 13 has a plurality of hanging lead pieces 15 that support mounting portion 11, and a plurality of electrode connection pieces 16 that connect a plurality of electrodes 12 for each mounting portion 11.

Figure 9A:
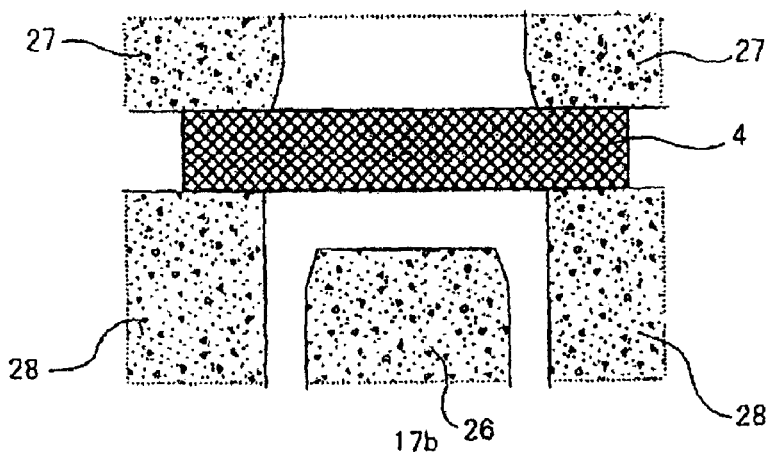
FIG. 9A is a sectional view that schematically illustrates a metal mold when performing a half blanking process on the aforementioned lead frame.
Figure 9B:
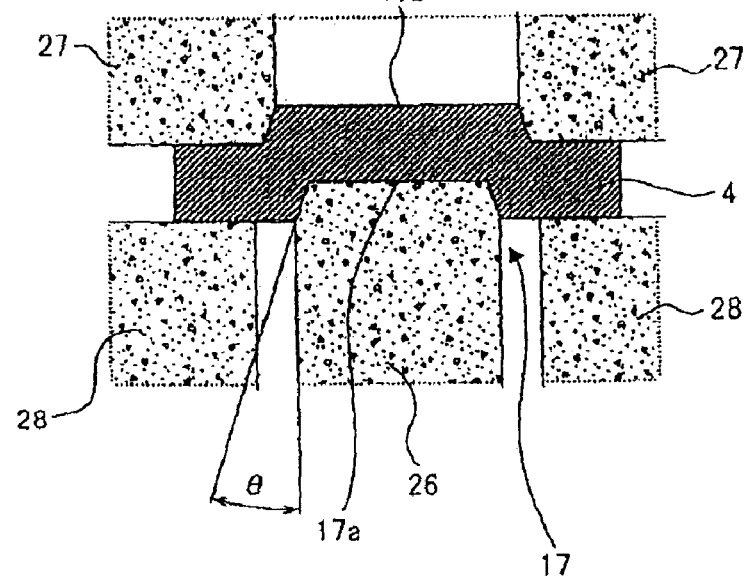
FIG. 9B is a sectional view that schematically illustrates a metal mold when performing a half blanking process on the aforementioned lead frame.

Half-blanking portion 17 at which semiconductor element 3 mounted on mounting portion 11 is covered with sealing resin material 6 to seal semiconductor element 3 is formed in lead frame 4. As illustrated in FIG. 9A and FIG. 9B, half-blanking portion 17 has concave portion 17a that is formed in the thickness direction from the rear side which is opposite to the front side on which semiconductor element 3 is mounted, and protrusion 17b that is formed in a condition in which protrusion 17b protrudes to the front side at a position corresponding to concave portion 17a. In half-blanking portion 17, both concave portion 17a and protrusion 17b form a wedge shape inside sealing resin material 6 that seals semiconductor element 3 to obtain an anchor effect. Thus, according to the present embodiment, the anchor effect can be improved in comparison to a lead frame related to the present invention in which only a concave shape is formed by etching.

As illustrated by the hatched regions in FIG. 7, half-blanking portions 17 are respectively formed at the outer circumferential portions of mounting portion 11, and corner portions 13, i.e. at hanging lead pieces 15 and electrode connection pieces 16.

Half-blanking portion 17 is formed so that a depth in the thickness direction of concave portion 17a is approximately 50%, i.e. about ½, of the thickness of lead frame 4. Preferably, the depth in the thickness direction of concave portion 17a is within a range of 40% or more to 65% or less with respect to the thickness of lead frame 4. When the depth in the thickness direction of concave portion 17a is less than 40%, elastic deformation is liable to occur in the half blanking process. This gives rise to insufficient plastic deformation, and it is therefore difficult to stabilize the working shape or dimensions. In addition, when the depth is less than 40%, a sufficient anchor effect cannot be obtained. In contrast, when the depth exceeds 65%, the shearing region increases in the half blanking process. As a result, the possibility of the lead frame rupturing increases. It is thus not desirable.

FIG. 9A and FIG. 9B are schematic sectional views of a metal mold when subjecting lead frame 4 to a half blanking process. The metal mold used in the half blanking process comprises punch 26, die 27, and press stripper 28. The metal mold works on lead frame 4 by pushing punch 26 in towards the side of die 27. At this time, concave portion 17a is formed on the side of punch 26 and protrusion 17b is formed on the side of die 27 of lead frame 4. In this case, side walls in the direction of the depth of concave portion 17a, i.e. side walls in the thickness direction of protrusion 17b, are inclined by a predetermined angle θ of inclination with respect to the thickness direction. The angle θ of inclination is preferably set to between approximately 10 degrees and 20 degrees to suppress the occurrence of stress and strain. In this connection, in a case where the angle θ of inclination is small, such as when the angle θ of inclination is, for example, 0 degrees, mold release characteristics are poor. This is not desirable because in that case the machining dimensions of half-blanking portion 17 will be unstable and lead frame 4 will rupture. This is because, in the half blanking process, after punch 26, that is a metal mold component, is pushed towards the side of die 27 to form concave portion 17a, when punch 26 moves in a direction away from lead frame 4 to return to its original position, the mold release characteristics are poor and concave portion 17a of lead frame 4 moves in conformity with the movement of punch 26. Further, since the inclined side walls are more likely to occur elastic deformation as the angle θ of inclination increases, there is the disadvantage that stress and strain will occur to a relatively large degree.

Figure 10A:
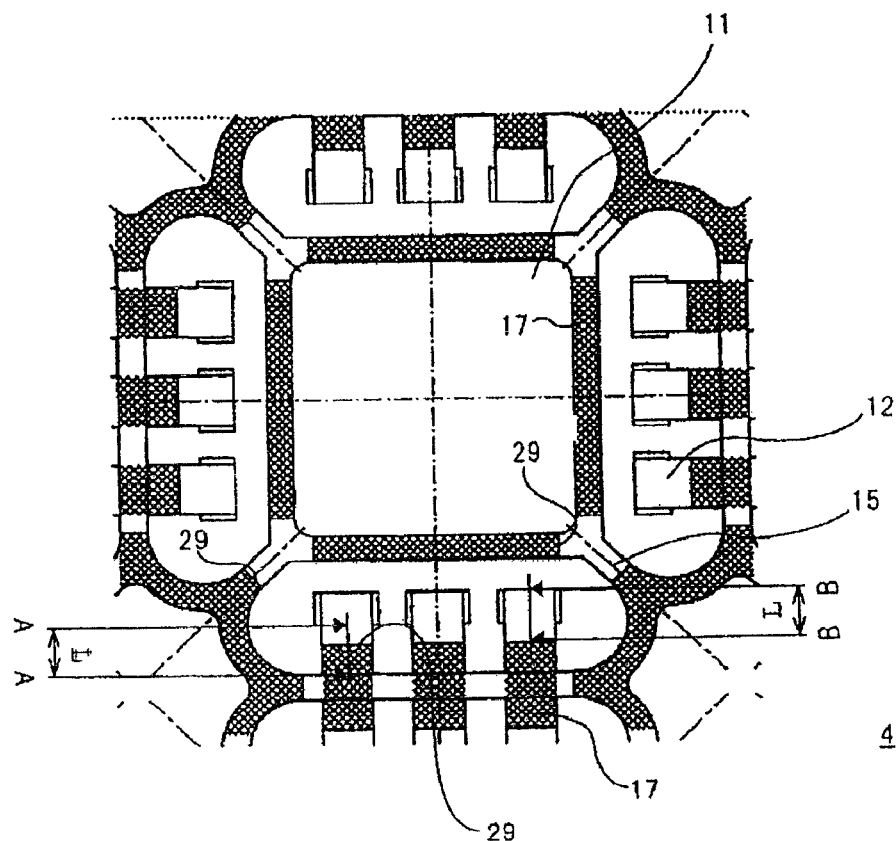
FIG. 10A is a view for describing a cross-sectional area of a half-blanking portion of the aforementioned lead frame.
Figure 10B:
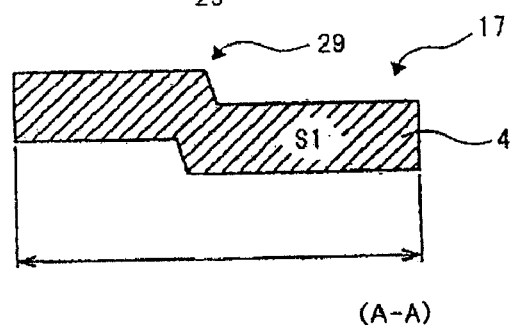
FIG. 10B is a view for describing a cross-sectional area of the half-blanking portion of the aforementioned lead frame.
Figure 10C:
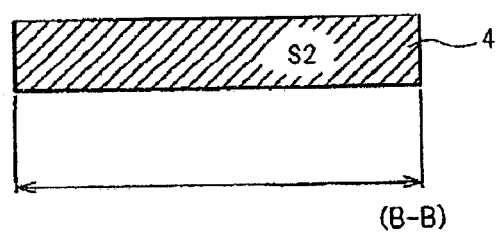
FIG. 10C is a view for describing a cross-sectional area of the half-blanking portion of the aforementioned lead frame.

As shown in FIG. 10A, FIG. 10B, and FIG. 10C, at a cross section that intersects in the thickness direction with boundary 29 of half-blanking portion 17, cross-sectional area S1 per unit length L at a portion intersecting boundary 29 is formed to be substantially equal with cross-sectional area S2 per unit length L at a portion that does not intersect with boundary 29. More specifically, by performing a half blanking process on lead frame 4 such that there is no change in the cross-sectional area of lead frame 4 before and after performing the half blanking process, stress and strain that arise when forming half-blanking portion 17 in lead frame 4 are suppressed, and deformation of lead frame 4 can be further prevented.

Figure 8:
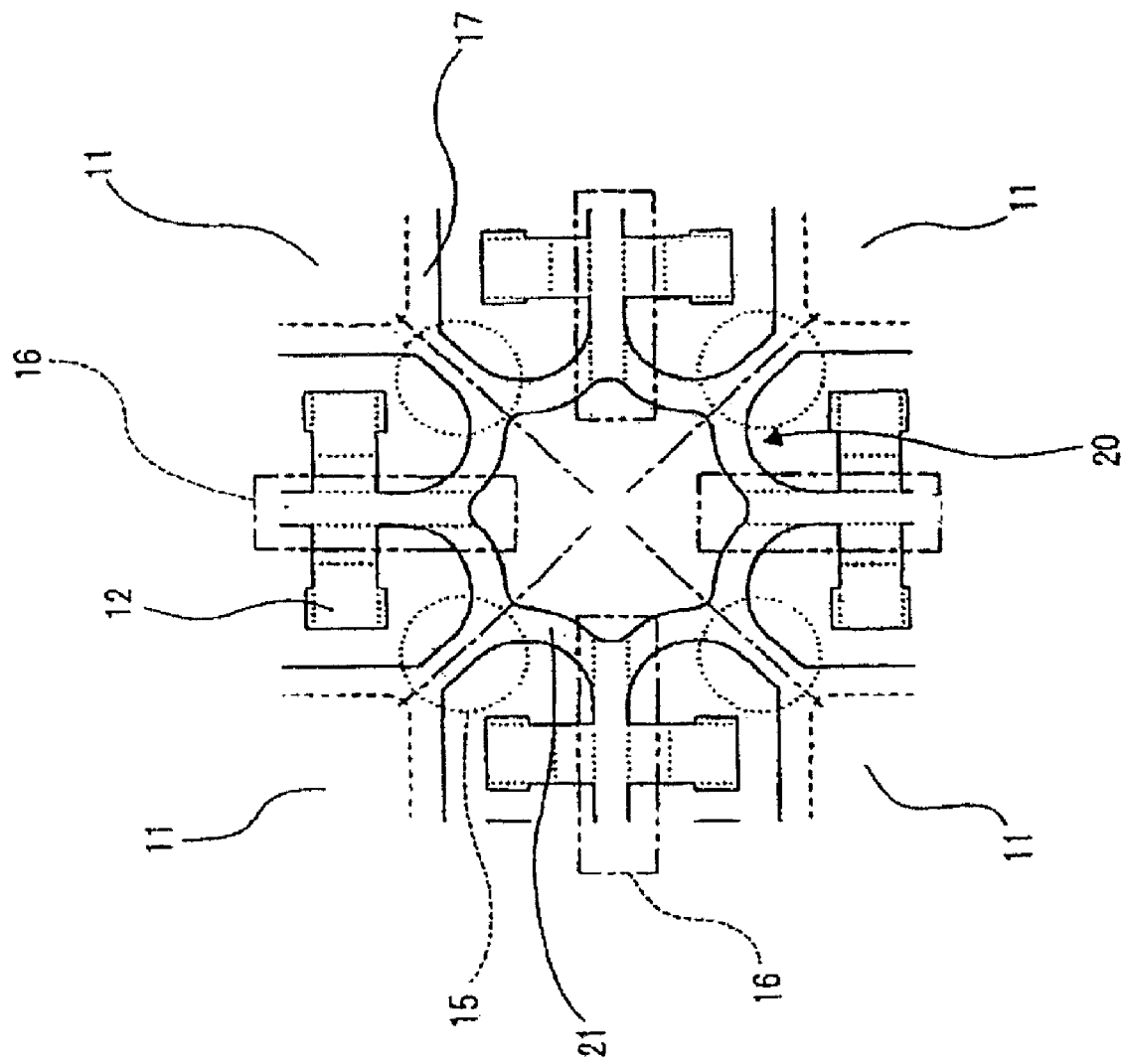
FIG. 8 is a plan view that shows an enlarged view of corner portions of the aforementioned lead frame.

As shown in FIG. 7 and FIG. 8, stress-dispersing portion 20 for dispersing stress that arises when forming half-blanking portion 17 in lead frame 4 is provided in corner portion 13 comprised by lead frame 4.

As shown in FIG. 8, stress-dispersing portion 20 provided in corner portion 13 has a plurality of beams 21 that connect hanging lead pieces 15 and electrode connection pieces 16 in an arc shape. Stress-dispersing portion 20 is formed by connecting the plurality of beams 21 in an annular shape and forms an opening in the center of the annular shape. By forming stress-dispersing portion 20 in this shape, as described above, an action arises that disperses and attenuates stress and strain.

Next, a state of stress that arises, when half-blanking portion 17 in lead frame 4 of the present embodiment is formed, is described referring to FIG. 11.

Figure 11B:
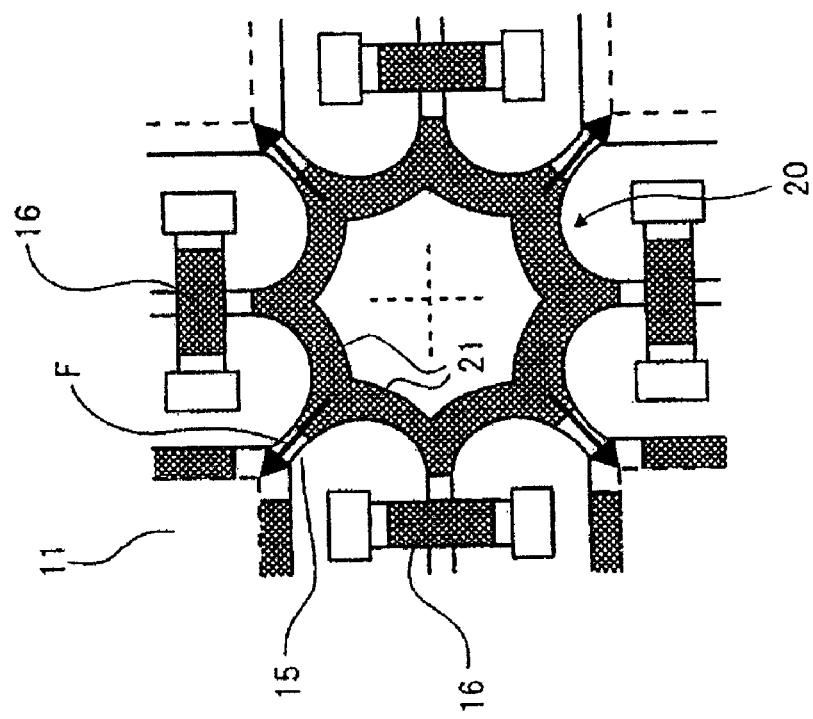
FIG. 11B is a plan view for describing an action of the stress-dispersing portion of the aforementioned lead frame.
Figure 11A:
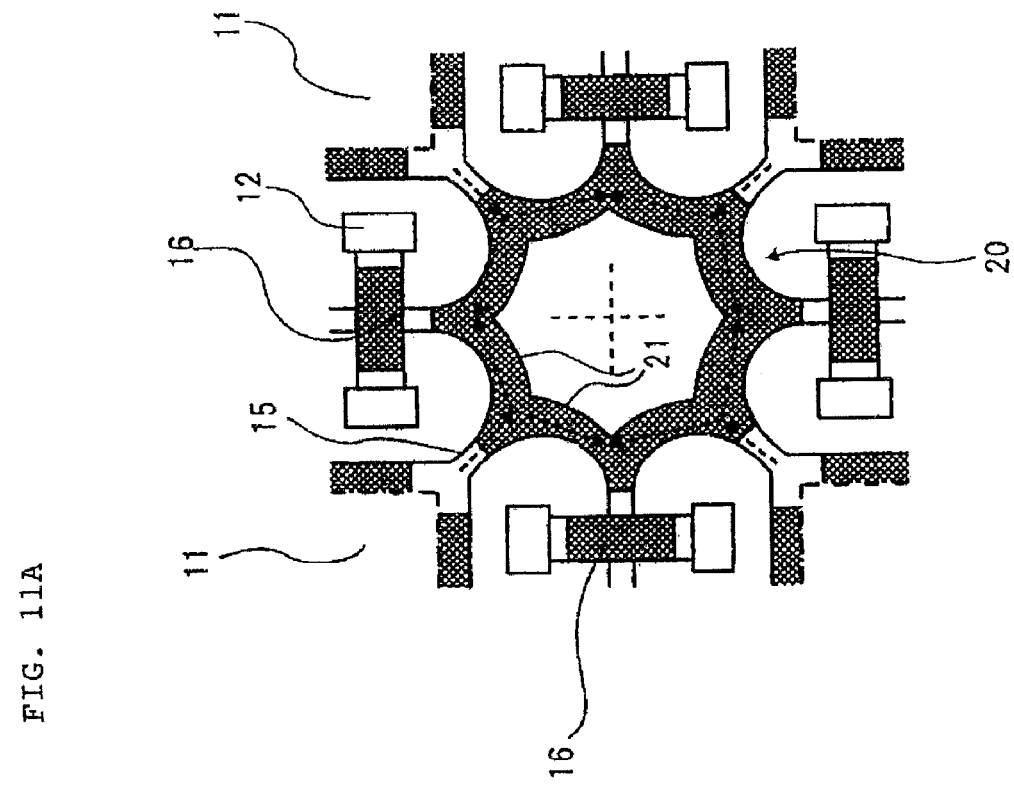
FIG. 11A is a plan view for describing an action of a stress-dispersing portion of the aforementioned lead frame.

As shown in FIG. 11A, stress that arises when performing a half blanking process at corner portion 13 and at an outer circumferential portion of mounting portion 11, is conveyed from the side of mounting portion 11 to hanging lead piece 15, as indicated by the arrows with dashed lines in FIG. 11A. Subsequently, the stress that is conveyed along hanging lead piece 15, is conveyed via arc-shaped beams 21 that branch in two from hanging lead piece 15. This stress is conveyed in a substantially tangential direction with respect to the arc formed by beams 21. The stress is then conveyed to the side of electrode connection piece 16 while being attenuated by beams 21 that bend to some degree. Therefore, the stress that is conveyed from the side of mounting portion 11 is dispersed and attenuated at stress-dispersing portion 20. Thus, as shown in FIG. 11B, the strength of force F reacts to the stress that is conveyed to the side of mounting portion 11 via hanging lead piece 15 from corner portion 13 is also relatively small. As a result, even in a case where lead frame 4 has a structure in which four corner portions 13 are arranged around mounting portion 11, deformation of mounting portion 11 due to forces F react to the stress from four corner portions 13 is satisfactorily prevented.

As described above, in lead frame 4 according to the present embodiment, stress-dispersing portion 20 that disperses stress that is conveyed from hanging lead piece 15 and electrode connection piece 16 is provided at corner portion 13 that connects a plurality of mounting portions 11. It is therefore possible to suppress the occurrence of stress and strain at mounting portion 11 when forming half-blanking portion 17 in lead frame 4.

Therefore, according to this lead frame 4 it is possible to implement press working in the manufacturing process of lead frame 4. Thus, according to this lead frame 4, a decrease in manufacturing cost can be expected, and in particular, lead frame 4 is favorably used in a case in which the number of semiconductor packages produced per lead frame is relatively small.

In addition, according to this lead frame 4, both protrusion 17b and concave portion 17a of half-blanking portion 17 form a wedge shape inside sealing resin material 6 that seals lead frame 4, to obtain the so-called anchor effect. Consequently, it is possible to improve the anchor effect achieved by the present embodiment in comparison with a structure that has only a concave portion formed by an etching process.

Figure 12:
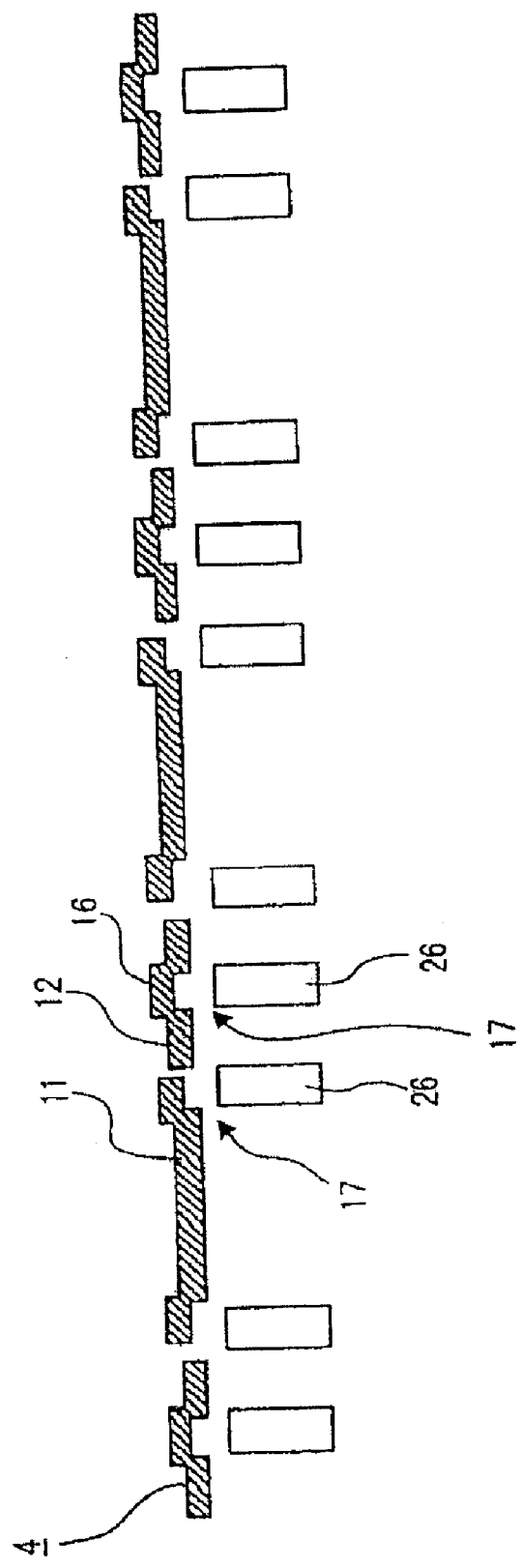
FIG. 12 is a sectional view that illustrates a manufacturing process of the aforementioned lead frame.

A method of manufacturing lead frame 4 arranged as described above has a first step of forming lead frame 4 into a predetermined shape by punching and, as shown in FIG. 12, a second step of forming half-blanking portion 17 in lead frame 4 by a half blanking process.

In this connection, as necessary, the method of manufacturing lead frame 4 may include annealing lead frame 4 after forming half-blanking portion 17 in the aforementioned second step. By performing an annealing process in this manner, minute amounts of internal stress that arise even though occurrence of stress is suppressed, as described above, are released from lead frame 4. It is thus possible to remove minute amounts of residual stress from lead frame 4 in which half-blanking portion 17 is formed.

A semiconductor package as a semiconductor apparatus of this embodiment that is made using lead frame 4 arranged, as described above, is described hereunder referring to FIG. 13.

Figure 13:
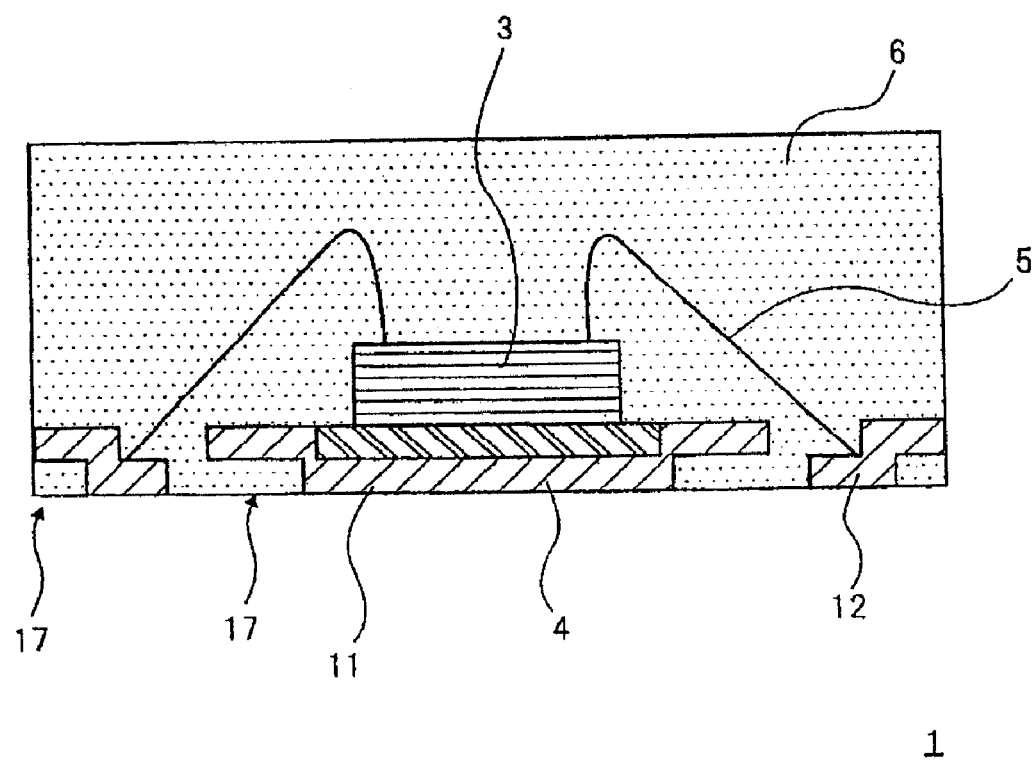
FIG. 13 is a sectional view that illustrates a semiconductor package according to the present embodiment.

As shown in FIG. 13, semiconductor package 1 of this embodiment comprises semiconductor element 3, lead frame 4 on which semiconductor element 3 is mounted and electrically connected, wire 5 as wiring material that electrically connects semiconductor element 3 and lead frame 4, and sealing resin material 6 that seals semiconductor element 3.

Next, a method of manufacturing the semiconductor package of this embodiment using lead frame 4 in which half-blanking portion 17 has been formed following the first and second steps in the above described lead frame manufacturing method is described with reference to FIG. 14 and FIG. 15.

The method of manufacturing a semiconductor package according to the present embodiment has a third step of mounting semiconductor elements 3 on mounting portions 11 of lead frame 4, a fourth step of electrically connecting semiconductor elements 3 and electrodes 12 through wires 5; a fifth step of sealing half-blanking portions 17, semiconductor elements 3, wires 5, and electrodes 12 with sealing resin material 6; and a sixth step of dividing lead frame 4 into individual semiconductor packages 1 by cutting along the length of electrode connection pieces 16 in a manner that it passes through the center of the opening formed in stress-dispersing portion 20 that is described above.

Figure 14:
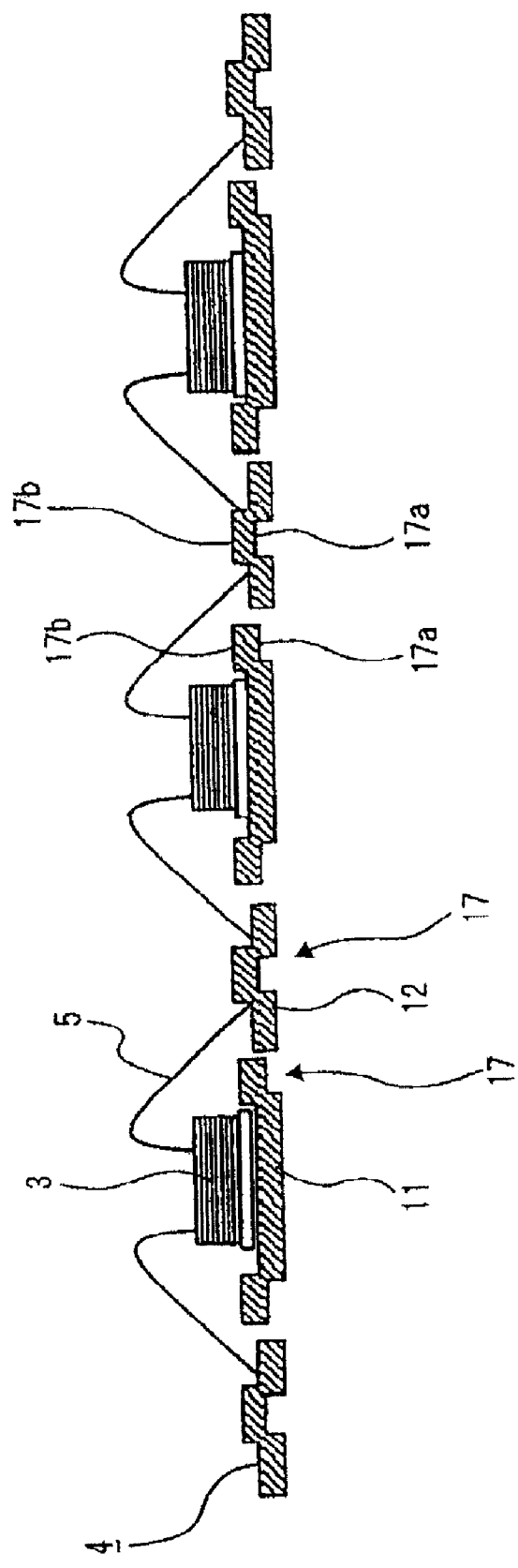
FIG. 14 is a sectional view that illustrates a process for manufacturing the aforementioned semiconductor package.
Figures 15A, 15B:
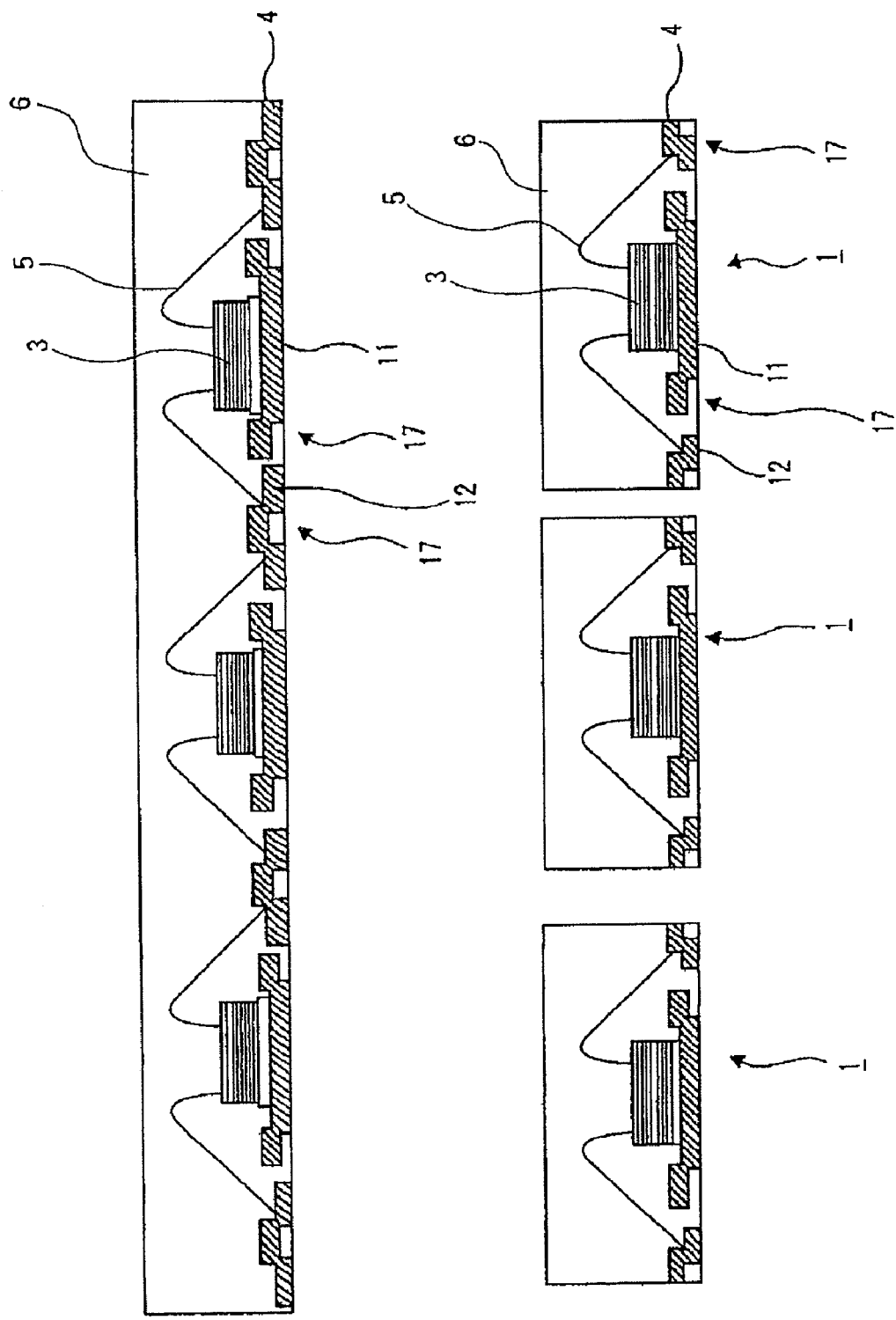
FIG. 15A is a sectional view that illustrates a process for manufacturing the aforementioned semiconductor package.
FIG. 15B is a sectional view that illustrates a process for manufacturing the aforementioned semiconductor package.

As shown in FIG. 14, in the third step, semiconductor elements 3 that are mounted on respective mounting portions 11 are each bonded with an adhesive or the like. In the fourth step, a plurality of wires 5 are connected that straddle between each terminal of semiconductor element 3 and each electrode 12 of lead frame 4. In the fifth step, as shown in FIG. 15A, semiconductor elements 3, electrodes 12 and wires 5, and a surface on one side of lead frame 4 are covered with sealing resin material 6, to thereby fill sealing resin material 6 in half-blanking portion 17. As a result, both concave portion 17a and protrusion 17b of half-blanking portion 17 respectively enter a wedge-like shape inside sealing resin material 6 to obtain an anchor effect. In the sixth step, as shown in FIG. 15B, individual semiconductor packages 1 are obtained by cutting lead frame 4 in a cross shape along electrode connection pieces 16 in a manner such that it passes through the center of an opening of each stress-dispersing portion 20.

While the invention has been shown and described with particular reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A lead frame, comprising:
    a plurality of mounting portions on which a semiconductor element is mounted;
    a plurality of electrodes to which said semiconductor element mounted on the respective mounting portion is electrically connected;
    a corner portion which connects said plurality of mounting portions, and which has a hanging lead piece that supports said mounting portions and an electrode connection piece that connects said plurality of electrodes; and
    a half-blanking portion having a concave portion that is formed in a thickness direction and a protrusion that is formed at a position corresponding to said concave portion, and which is covered with a sealing resin material that seals said semiconductor element;
    wherein a stress-dispersing portion for dispersing a stress that arises, when said half-blanking portion is formed, is provided in said corner portion.

2. The lead frame according to claim 1, wherein said stress-dispersing portion has a plurality of beams that connect said hanging lead piece and said electrode connection piece in an arc shape, and is formed in an annular shape in which said plurality of beams are connected.

3. The lead frame according to claim 1, wherein said half-blanking portion is formed in said mounting portion, said hanging lead piece, and said electrode connection piece, respectively.

4. The lead frame according to claim 1, wherein a depth in said thickness direction of said concave portion of said half-blanking portion is within a minimum/maximum range of 40% to 65%.

5. The lead frame according to claim 1, wherein, at a cross section which, in said thickness direction, intersects a boundary of said half-blanking portion, a cross-sectional area per unit length of a portion intersecting said boundary is substantially equal to a cross-sectional area per unit length of a portion that does not intersect said boundary.

6. The lead frame according to claim 1, wherein, in said half-blanking portion, a side wall in said thickness direction of said concave portion and said protrusion is inclined with respect to said thickness direction.

7. A semiconductor apparatus, comprising a lead frame according to claim 1, wherein said semiconductor element is mounted in said lead frame, and a sealing resin material seals said semiconductor element.

* * * * *